US009679899B2

(12) United States Patent
Loubet et al.

(10) Patent No.: US 9,679,899 B2
(45) Date of Patent: Jun. 13, 2017

(54) CO-INTEGRATION OF TENSILE SILICON AND COMPRESSIVE SILICON GERMANIUM

(71) Applicant: STMicroelectronics, Inc., Coppell, TX (US)

(72) Inventors: Nicolas Loubet, Guilderland, NY (US); Pierre Morin, Albany, NY (US); Yann Mignot, Slingerlands, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/833,857

(22) Filed: Aug. 24, 2015

(65) Prior Publication Data

US 2017/0062426 A1    Mar. 2, 2017

(51) Int. Cl.
| | |
|---|---|
| H01L 27/092 | (2006.01) |
| H01L 29/165 | (2006.01) |
| H01L 21/02 | (2006.01) |
| H01L 21/762 | (2006.01) |
| H01L 21/8238 | (2006.01) |
| H01L 29/49 | (2006.01) |
| H01L 29/78 | (2006.01) |
| H01L 29/06 | (2006.01) |

(52) U.S. Cl.
CPC .... *H01L 27/0924* (2013.01); *H01L 21/02381* (2013.01); *H01L 21/02532* (2013.01); *H01L 21/76224* (2013.01); *H01L 21/823807* (2013.01); *H01L 21/823821* (2013.01); *H01L 21/823878* (2013.01); *H01L 27/0922* (2013.01); *H01L 29/0649* (2013.01); *H01L 29/165* (2013.01); *H01L 29/4916* (2013.01); *H01L 29/7842* (2013.01)

(58) Field of Classification Search
CPC .......... H01L 27/0924; H01L 21/76224; H01L 29/165; H01L 21/02381; H01L 21/02532; H01L 29/0649; H01L 27/0922; H01L 21/823878; H01L 21/823821; H01L 29/4916; H01L 29/7842; H01L 21/823807
See application file for complete search history.

(56) References Cited

U.S. PATENT DOCUMENTS

| | | | |
|---|---|---|---|
| 8,211,772 B2 | 7/2012 | Kavalieros et al. | |
| 8,759,874 B1 | 6/2014 | Loubet et al. | |
| 2008/0064197 A1 | 3/2008 | Zhu et al. | |

(Continued)

OTHER PUBLICATIONS

U.S. Appl. No. 14/231,466, entitled "SOI FinFET Transistor with Strained Channel".

(Continued)

*Primary Examiner* — William F Kraig
*Assistant Examiner* — Pavel Ivanov
(74) *Attorney, Agent, or Firm* — Seed IP Law Group LLP

(57) ABSTRACT

Integrated circuits are disclosed in which the strain properties of adjacent pFETs and nFETs are independently adjustable. The pFETs include compressive-strained SiGe on a silicon substrate, while the nFETs include tensile-strained silicon on a strain-relaxed SiGe substrate. Adjacent n-type and p-type FinFETs are separated by electrically insulating regions formed by a damascene process. During formation of the insulating regions, the SiGe substrate supporting the n-type devices is permitted to relax elastically, thereby limiting defect formation in the crystal lattice of the SiGe substrate.

20 Claims, 9 Drawing Sheets

(56) References Cited

U.S. PATENT DOCUMENTS

| | | |
|---|---|---|
| 2008/0296615 A1* | 12/2008 | Savage ............... H01L 21/6835 257/190 |
| 2012/0074464 A1 | 3/2012 | Cea et al. |
| 2012/0104472 A1 | 5/2012 | Xu et al. |
| 2012/0168830 A1* | 7/2012 | Usuda ............... H01L 21/28518 257/288 |
| 2013/0193446 A1 | 8/2013 | Chao et al. |
| 2014/0099774 A1 | 4/2014 | Vincent |
| 2014/0175554 A1 | 6/2014 | Loubet et al. |
| 2014/0339643 A1 | 11/2014 | Cheng et al. |
| 2015/0255543 A1 | 9/2015 | Cheng et al. |
| 2015/0263097 A1 | 9/2015 | Cheng et al. |
| 2015/0279970 A1 | 10/2015 | Zhang |
| 2016/0064483 A1 | 3/2016 | Kelly et al. |
| 2016/0163648 A1 | 6/2016 | Peter et al. |
| 2016/0172462 A1 | 6/2016 | Cheng et al. |
| 2016/0190303 A1 | 6/2016 | Liu et al. |
| 2016/0190304 A1 | 6/2016 | Morin et al. |
| 2016/0190325 A1 | 6/2016 | Liu et al. |
| 2016/0276478 A1 | 9/2016 | Pawlak et al. |
| 2016/0343734 A1 | 11/2016 | Doris et al. |
| 2016/0372383 A1 | 12/2016 | Basker et al. |
| 2017/0005169 A1 | 1/2017 | Loubet et al. |

OTHER PUBLICATIONS

U.S. Appl. No. 14/588,116, entitled "Silicon Germanium-on-insulator FinFET".
U.S. Appl. No. 14/588,221, entitled "Defect-Free Strain-Relaxed Buffer Layer".

\* cited by examiner

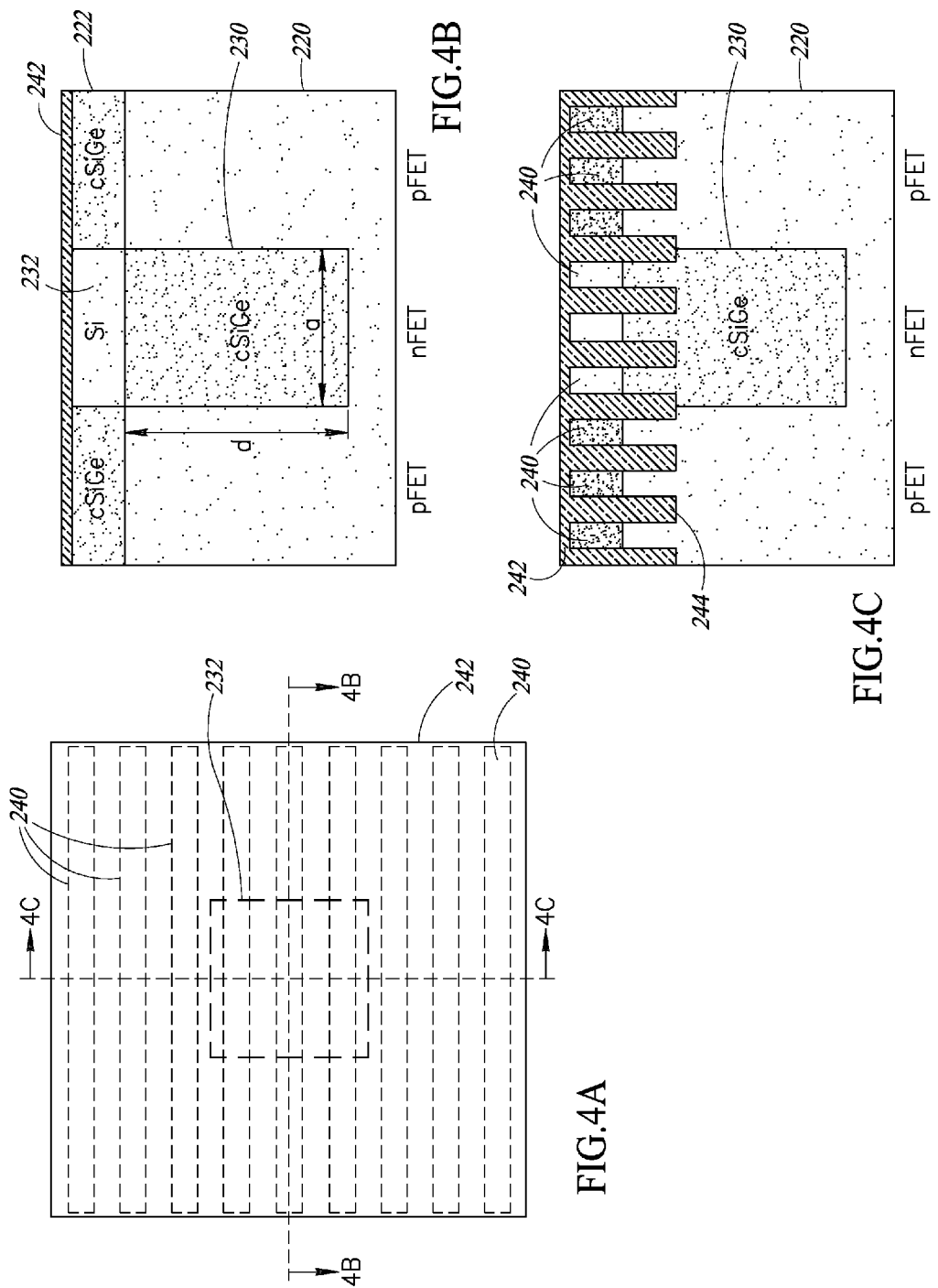

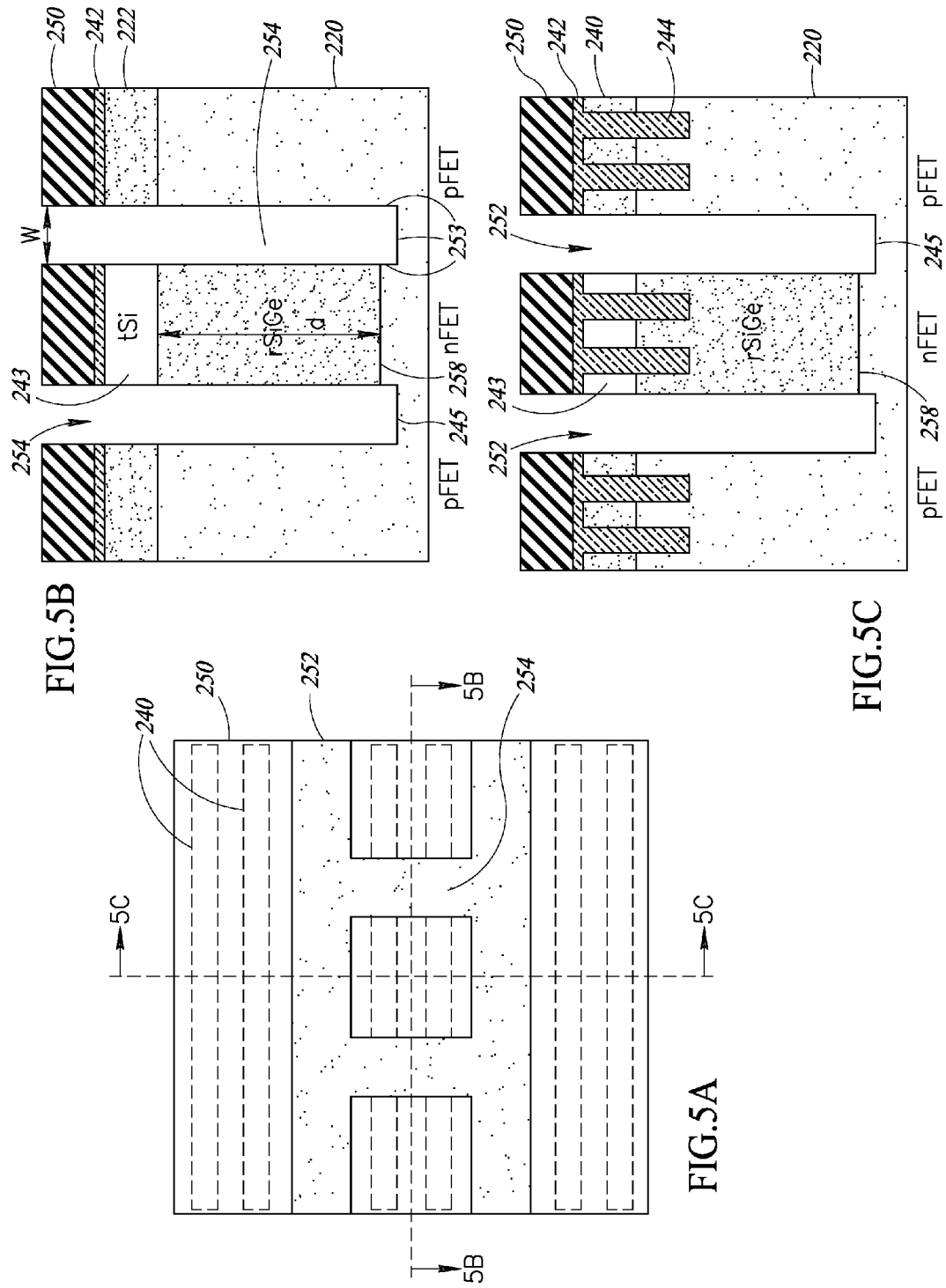

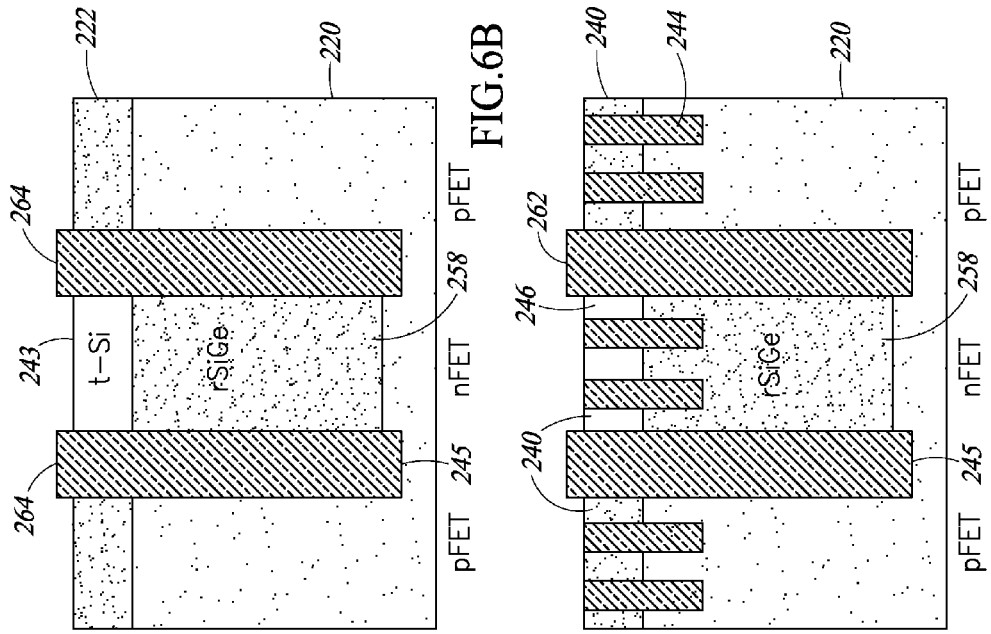
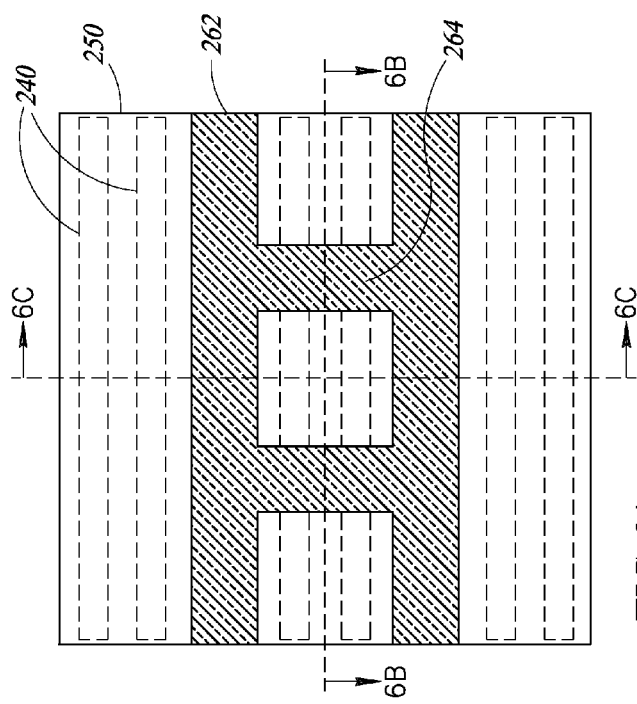
FIG.6B
FIG.6C
FIG.6A

CO-INTEGRATION OF TENSILE SILICON AND COMPRESSIVE SILICON GERMANIUM

BACKGROUND

Technical Field

The present disclosure generally relates to techniques for fabricating high performance fin field-effect transistors (Fin-FETs) and, in particular, to techniques for defect reduction in strained silicon transistors.

Description of the Related Art

Advanced integrated circuits often feature strained channel transistors, silicon-on-insulator (SOI) substrates, FinFET structures, or combinations thereof, in order to continue scaling transistor gate lengths below 20 nm. Such technologies allow the channel length of the transistor to be made smaller while minimizing detrimental consequences such as current leakage and other short channel effects.

A FinFET is an electronic switching device that features a conduction channel in the form of a semiconducting fin that extends outward from the substrate surface. In such a device, the gate, which controls current flow in the fin, wraps around three sides of the fin so as to influence current flow from three surfaces instead of one. The improved control achieved with a FinFET design results in faster switching performance in the "on" state and less current leakage in the "off" state than is possible in a conventional planar device. FinFETs are described in further detail in U.S. Pat. No. 8,759,874, and U.S. Patent Application Publication US2014/0175554.

Strained silicon transistors have been developed to increase mobility of charge carriers, i.e., electrons or holes, passing through a semiconductor lattice. Incorporating strain into the channel of a semiconductor device stretches the crystal lattice, thereby increasing charge carrier mobility in the channel so that the device becomes a more responsive switch. Introducing a compressive strain into a pFET transistor tends to increase hole mobility in the channel, resulting in a faster switching response to changes in voltage applied to the transistor gate. Likewise, introducing a tensile strain into an nFET tends to increase electron mobility in the channel, also resulting in a faster switching response.

There are many ways to introduce tensile or compressive strain into transistors, for both planar devices and FinFETs. In general, such techniques typically entail incorporating into the device epitaxial layers of one or more materials having crystal lattice dimensions or geometries that differ slightly from those of the silicon substrate. Strain and mobility effects within an epitaxially grown crystal are tuned by controlling the elemental composition of the crystal. Such epitaxial layers can be incorporated into source and drain regions, into the transistor gate that is used to modulate current flow in the channel, or into the channel itself, which is a portion of the fin. For example, one way to introduce strain is to replace bulk silicon from the source and drain regions, or from the channel, with silicon compounds such as silicon germanium (SiGe). Because Si—Ge bonds are longer than Si—Si bonds, there is more open space in a SiGe lattice. The presence of germanium atoms having longer bonds stretches the lattice, causing internal strain. Electrons can move more freely through a lattice that contains elongated Si—Ge and Ge—Ge bonds, than through a lattice that contains shorter Si—Si bonds. Replacing silicon atoms with SiGe atoms can be accomplished during a controlled process of epitaxial crystal growth, in which a new SiGe crystal layer is grown from the surface of a bulk silicon crystal, while maintaining the same crystal structure of the underlying bulk silicon crystal. It has been determined that epitaxial SiGe films containing a high concentration of germanium, e.g., in the range of 25%-40%, provide enhanced electron mobility compared with lower concentration SiGe films. Thus, from the point of view of device performance, it is generally advantageous to increase the percent concentration of germanium atoms in the fins in a FinFET.

Alternatively, strain can be induced in the fin from below the device by using various types of silicon-on-insulator (SOI) substrates. An SOI substrate features a buried insulator, typically a buried oxide layer (BOX) underneath the active area. SOI FinFET devices have been disclosed in patent applications assigned to the present assignee, for example, U.S. patent application Ser. No. 14/231,466, entitled "SOI FinFET Transistor with Strained Channel," U.S. patent application Ser. No. 14/588,116, entitled "Silicon Germanium-on-insulator FinFET," and U.S. patent application Ser. No. 14/588,221, entitled "Defect-Free Strain-Relaxed Buffer Layer."

While a strained silicon lattice is beneficial, creating strain by incorporating germanium atoms using existing methods tends to damage the crystal lattice. As a result, the lattice structures of germanium-rich films tend to be mechanically unstable, especially if they contain a high number of structural defects such as faults, or dislocations. Furthermore, a mechanically unstable SiGe fin may be structurally limited with regard to its aspect ratio, or height-to-width ratio. Such a limitation is undesirable because one advantage of a FinFET is that the fin, being a vertical structure, has a small footprint.

BRIEF SUMMARY

Dislocation defects that cause mechanical instability in FinFETs can be avoided by creating a germanium-rich layer that is relaxed, as an alternative to a strained film. A self-aligned SiGe FinFET device of the present disclosure features a strain-relaxed substrate having a high germanium concentration. Integrated circuits are disclosed in which the strain properties of constituent pFETs and nFETs are independently adjustable. The pFETs include compressive-strained SiGe on a silicon substrate, while the nFETs include tensile-strained silicon on a strain-relaxed SiGe substrate. Adjacent n-type and p-type FinFETs are separated by insulating regions formed using a damascene process. During formation of the insulating regions, the SiGe substrate supporting the n-type devices is permitted to relax elastically, thereby limiting defect formation in the crystal lattice of the SiGe substrate.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIG. 4A is a top plan view of an active layer of silicon indicating the orientation of fins formed below an oxide surface, according to one embodiment as described herein.

FIG. 4B is a cross-sectional view of the active layer of silicon shown in FIG. 4A, along a cut line 4B-4B substantially parallel to a fin, according to one embodiment as described herein.

FIG. 4C is a cross-sectional view of an active layer of silicon along a cut line 4C-4C across the fins, according to one embodiment as described herein.

FIG. 5A is a top plan view of the active layer of silicon following formation of isolation trenches between nFET and pFET regions, according to one embodiment as described herein.

FIGS. 5B, 5C are cross-sectional views corresponding to FIG. 5A.

FIG. 6A is a top plan view of the active layer of silicon after filling the isolation trenches and inter-fin regions with oxide, according to one embodiment as described herein.

FIGS. 6B, 6C are cross-sectional views corresponding to FIG. 6A.

DETAILED DESCRIPTION

Figure 1:
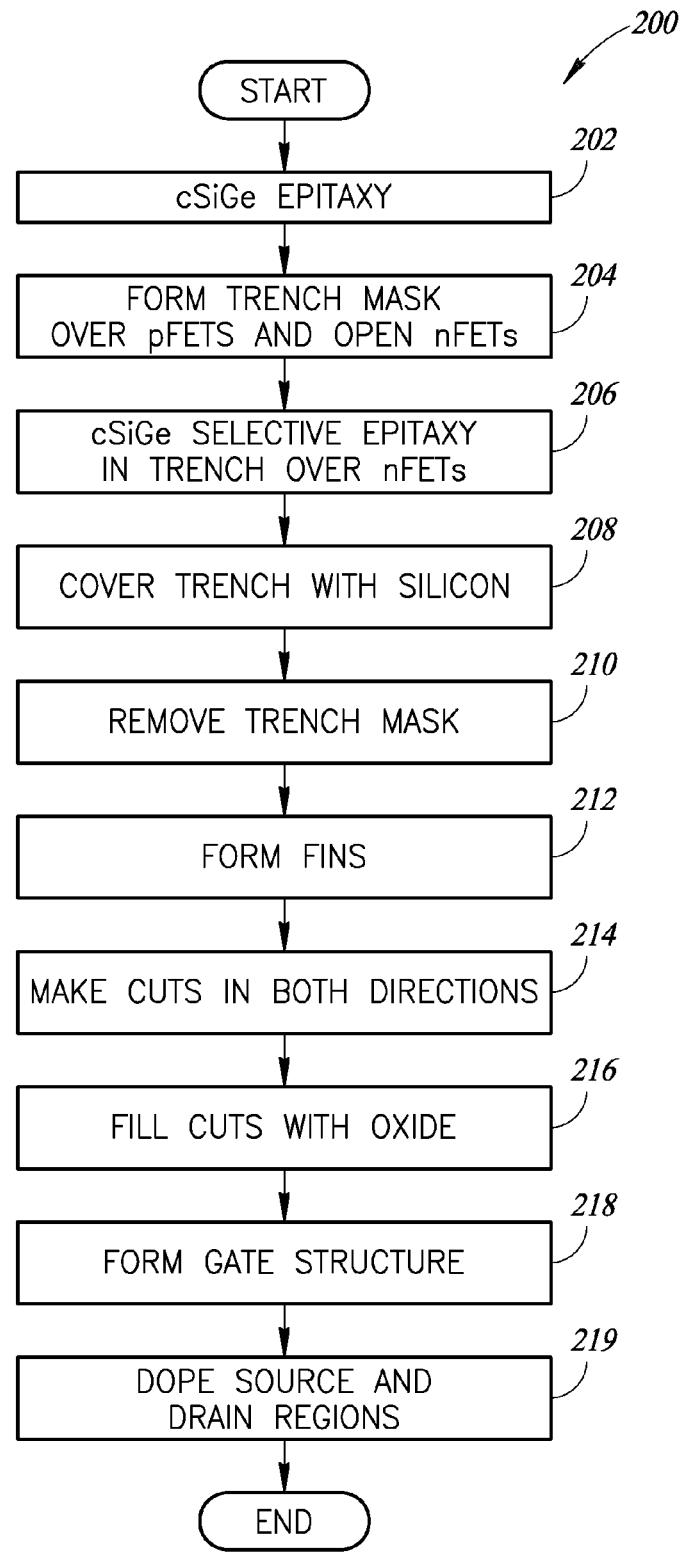
FIG. 1 is a flow diagram showing steps in a first method of fabricating an integrated circuit that includes compressive strained SiGe pFETs together with tensile silicon nFETs, according to one embodiment as described herein.
Figure 2A:
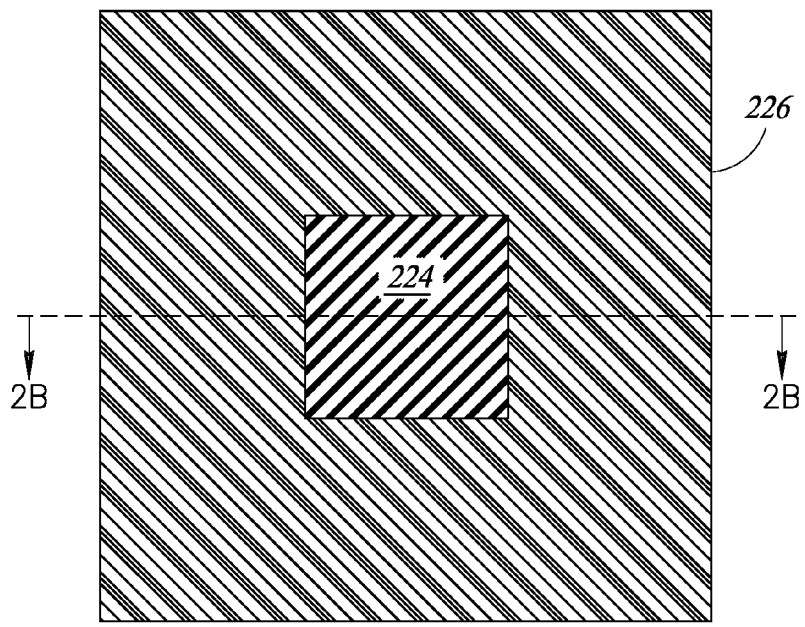
FIG. 2A is a top plan view of a SiGe active layer on a silicon substrate, according to one embodiment as described herein.
Figure 2B:
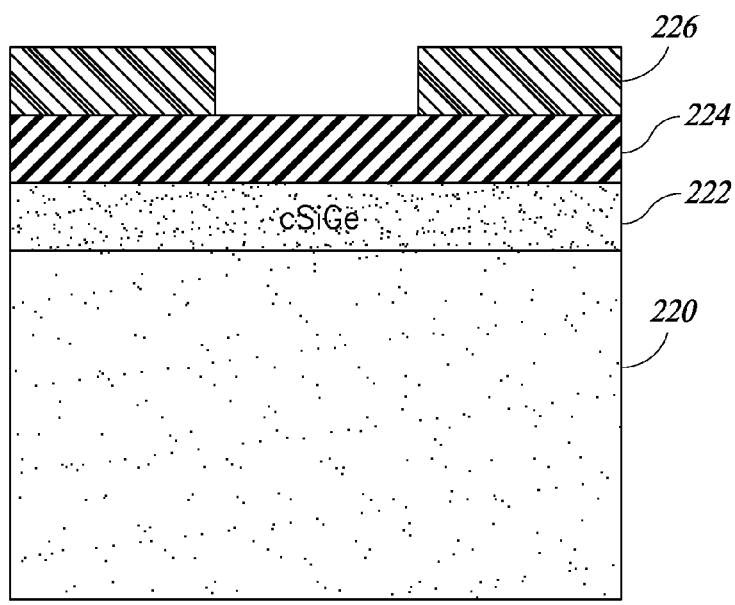
FIG. 2B is a cross-sectional view corresponding to FIG. 2A.
Figure 3A:
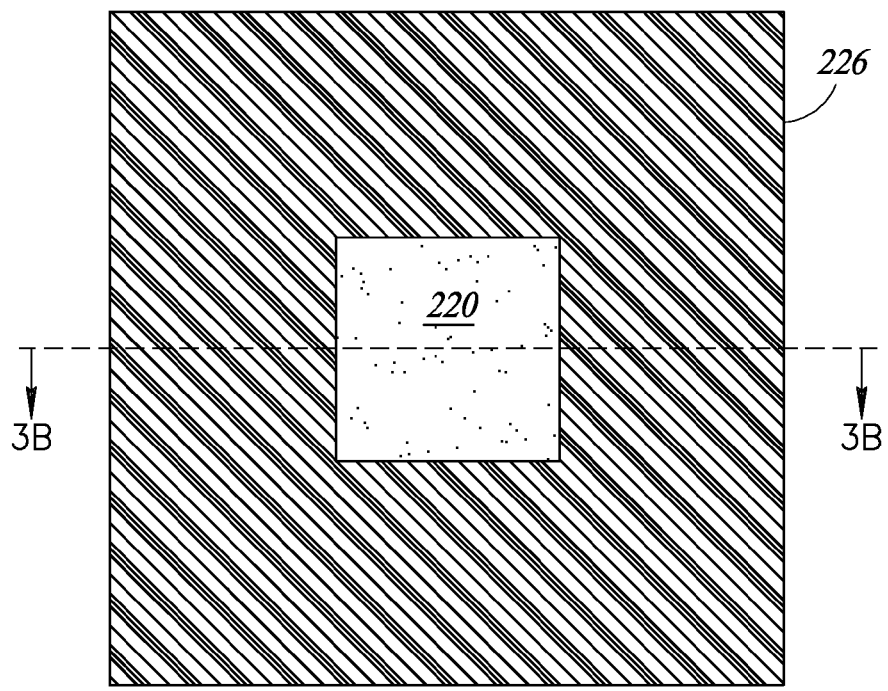
FIG. 3A is a top plan view of a large trench formed in the nFET region of the silicon substrate, according to one embodiment as described herein.
Figure 3B:
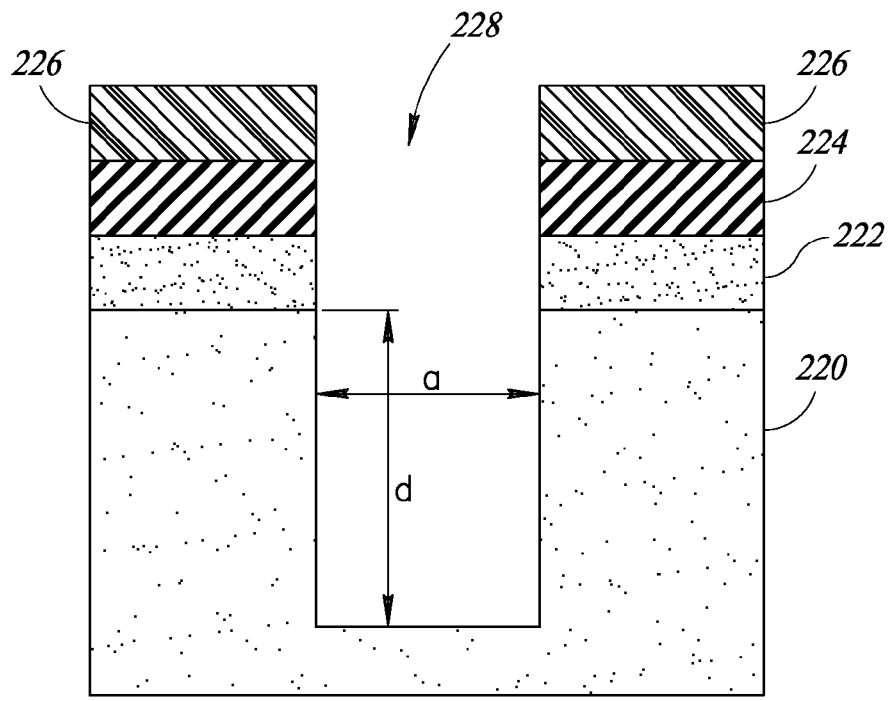
FIG. 3B is a cross-sectional view of the large trench shown in FIG. 3A.

In the following description, certain specific details are set forth in order to provide a thorough understanding of various aspects of the disclosed subject matter. However, the disclosed subject matter may be practiced without these specific details. In some instances, well-known structures and methods of semiconductor processing have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to co-integrated tensile nFETs and compressive pFETs that have been produced; however, the present disclosure and the reference to certain materials, dimensions, and the details and ordering of processing steps are exemplary and should not be limited to those shown.

Turning now to the figures, FIG. 1 shows steps in a method 200 of fabricating p-type FinFETs, or pFETs, having compressive strain, co-integrated with n-type FinFETs, or nFETs, having tensile strain, according to one embodiment. Steps 202-219 in the method 200 are further illustrated by FIGS. 2A-7C, and described below. In each of the Figures, A is a top plan view of co-integrated FinFETs at the present step during fabrication, indicating cut lines for cross-sectional views; B is a cross-sectional view along a cut line parallel to the fins of the FinFETs; and C is a cross-sectional view along a cut line transverse to the fins. One exemplary nFET and two exemplary pFETs are shown in each cross-sectional view.

At 202, a blanket epitaxial SiGe film having compressive strain is grown on a silicon substrate 220 to form a compressive SiGe active layer 222. The compressive SiGe active layer 222 (cSiGe) is desirably in the range of about 10-100 nm thick with a target thickness of 40 nm and has a Ge concentration in the range of about 15-50%, with a target concentration of 25% germanium. The compressive SiGe active layer 222 is a fully compressively-strained film that will include at least one source and one drain of a p-type FinFET, and a fin channel coupling the source to the drain.

At 204, the compressive SiGe active layer 222 and the silicon substrate 220 are patterned together to open the nFET regions, and to cover the pFET regions, according to one embodiment as illustrated in FIGS. 2A, 2B, 3A, and 3B. First, a blanket hard mask 224 is deposited on the compressive SiGe active layer 222, and patterned in the usual way, using a photoresist 226, and, optionally, an optical planarization layer (OPL). The hard mask 224, and subsequent hard masks described below, can be made of SiN, $SiO_2$, or a $SiO_2$/SiN bi-layer. The hard mask 224 can be deposited according to any conventional method such as, for example, plasma-enhanced CVD (PE-CVD), low pressure CVD (LP-CVD), rapid thermal CD (RT-CVD), atomic layer deposition (ALD), or the like. Then, the SiN hard mask 224 is used to etch an opening 228 into the underlying epitaxial SiGe layer, the opening 228 extending further into the silicon substrate 220 to form a damascene trench having a width "a" and a depth "d." The width can be anywhere in the range of 10 nm-100 um. The depth is desirably in the range of about 50-400 nm. The dimensions a and d may depend on, for example, whether or not logic or SRAM devices are being fabricated.

At 206, a thick SiGe layer 230 is formed to fill the opening 228, according to one embodiment as shown in FIGS. 4B, 4C. Filling the opening 228 completes a damascene process that forms a strained SiGe layer in the silicon substrate 220, underneath the active layer where the nFET will later be formed. The thick SiGe layer 230 effectively serves as a substrate taking the place of the silicon substrate 220. In one embodiment, the thick SiGe layer 230 is formed by selective epitaxial growth from the underlying silicon substrate 220. The selective epitaxy process proceeds from bottom to top, in the nFET region only, stopping at the surface of the silicon substrate 220. The hard mask 224 remains in place during the selective epitaxy process. A chlorine-based chemistry or a silane-based chemistry, for example, can be used to suppress growth from the sidewalls of the silicon substrate 220, thereby achieving a directional deposition. Such a technique for directional epitaxy is known to those skilled in the art of epitaxial crystal growth. The thickness of the thick SiGe layer 230 can be maximized without forming crystal defects by tuning the germanium concentration. Further optimization to maximize mechanical stress in the fin channels may entail forming a thick SiGe layer 230 that has a vertical germanium concentration gradient that can be achieved by varying an amount of germanium during the directional deposition step. Alternatively, other techniques for directional epitaxy may be used to grow the thick SiGe layer 230. The resulting inlaid thick SiGe layer 230 in the nFET region has a compressive strain.

At 208, an epitaxial silicon active layer 232 is formed, according to one embodiment, as shown in FIGS. 4B and 4C. In one embodiment, the epitaxial silicon active layer 232 is also grown directionally upward from the surface of the thick SiGe layer 230, while suppressing growth from sidewalls of the SiGe active layer 222. The epitaxial silicon active layer 232 has a thickness target approximately equal to that of the surrounding compressive SiGe layer 222. The epitaxial silicon active layer 232 is thus formed in the active region that will include a source and a drain of an n-type FinFET, as well as a fin channel coupling the source to the drain. The epitaxial silicon active layer 232 can be grown as an added step in the same process as the thick SiGe layer 230, in which a flow of germanium gas is turned off at the transition between SiGe and silicon. A timed epitaxy process can be used, wherein the time for each step is based on the desired mask opening a, and a known growth rate for each of epitaxial SiGe and epitaxial silicon. Source and drain regions of the epitaxial silicon active layer 232 may be doped in-situ during epitaxial growth. The epitaxial silicon active layer 232 thus formed is a relaxed layer, having a crystal structure similar to that of the substrate 220.

At 210, following the directional epitaxy steps, the hard mask 224 is removed e.g., by any suitable method.

At 212, fins 240 are formed in the compressive SiGe active layer 222, and in the tensile silicon active layer 232, according to one embodiment, as shown in FIGS. 4A and 4C. FIG. 4A shows a top view of the nFET and pFETs after formation of the fins 240 and an inter-fin oxide 244. Although the surface is covered with a pad oxide 242, the underlying fins 240 are indicated by dashed lines, as is the epitaxial silicon active layer 232 which also delineates the boundaries of the thick SiGe layer 230.

In a FinFET device, the fin embodies the conduction channel, which couples source and drain regions to one another. To form the fins 240, shown in FIG. 4C, first the pad oxide 242 is deposited, and on top of the pad oxide 242, a pad nitride (SiN) layer is used as a fin hard mask (not shown) to define the fins 240 by a conventional photolithography method. Alternatively, the fins 240 can be defined using a sidewall image transfer (SIT) method that is capable of producing very narrow features, as is known in the art. In one embodiment, the fins 240 have fin widths in the range of about 5-20 nm. In the pFET regions, the fins 240 extend vertically into the silicon substrate 220 below the compressive SiGe active layer 222. In the nFET region, the fins 240 extend vertically through the tensile silicon active layer 232 and into the thick SiGe layer 230. Following fin formation, the pad oxide 242 and the fin hard mask, both bearing a fin pattern, are removed. In preparation for the next process step, spaces between the fins 240 are filled with the inter-fin oxide 244. The inter-fin oxide 244 is then planarized so as to re-establish the pad oxide 242, slightly above the fins 240 and the inter-fin oxide 244.

At 214, parallel cuts 252, substantially parallel to the fins 240, and perpendicular cuts 254, transverse to the fins 240, are made between pFET and nFET active regions, according to one embodiment, as shown in FIGS. 5A-5C. First, a SiN cut hard mask 250 is formed on top of the pad oxide 242. The parallel cuts 252 are then patterned in the SiN cut hard mask 250, as shown in FIGS. 5A, 5C. The pattern of parallel cuts 252 shown in FIG. 5A is then transferred to the substrate 220 by etching, so that the parallel cuts 252 extend downward between the thick SiGe layer 230 and the silicon substrate 220 to a cut depth 245. In FIGS. 5B, 5C, the cut depth 245 is shown slightly below the SiGe depth d. In general, however, the cut depth 245 can be less than, equal to, or greater than, the depth d of the thick SiGe layer 230, although it may be advantageous for the cut depth 245 to be greater than the depth d of the thick SiGe layer 230.

Next, in a subsequent lithography step, perpendicular cuts 254 are patterned in the cut hard mask 250, as shown in FIGS. 5A, 5B. The pattern of perpendicular cuts 254, shown in FIG. 5A, is then transferred to the substrate 220 by etching, so that the perpendicular cuts 254 extend downward between the thick SiGe layer 230 and the silicon substrate 220 to about the same cut depth 245 as the parallel cuts 252, as shown in FIG. 5B. Each one of the cuts 252, 254 thus creates three free surfaces 253 adjacent to a lower portion of the thick SiGe layer 230. The depths of the perpendicular cuts 254 can be less than, equal to, or greater than the depths of the parallel cuts 252.

As the parallel cuts 252 are made, the thick SiGe layer 230 relaxes elastically (rSiGe), either partially or fully, in a horizontal direction parallel to the active layers 222 and 232. Such elastic relaxation transforms the thick SiGe layer 230 from a compressively strained layer to a strain-relaxed SiGe region 258 inlaid in the silicon substrate 220. The elastic relaxation occurs without creating defects, as would otherwise occur in a conventional process that relies on plastic relaxation. Likewise, as the perpendicular cuts 254 are made, the strain-relaxed SiGe region 258 experiences a biaxial elastic relaxation in which the SiGe fully relaxes elastically, in all directions, again without creating defects. At the same time as the cuts 252, 254 are made, the overlying epitaxial silicon active layer 232 is segmented from the compressive SiGe active layer 222, and the epitaxial silicon active layer 232 is transformed into a biaxially tensilely-strained film. The resulting tensile silicon active layer 243 provides superior electron mobility within the nFET fins. Meanwhile, the compressive SiGe active layer 222 on either side of the tensile silicon active layer 243 remains fully compressively-strained to provide superior hole mobility within the pFET fins. In this way, the compressive strain in the pFETs and the tensile strain in the nFETs are adjusted independently.

At 216, photoresist is stripped from the cut hard mask 250 and the cuts 252, 254 are filled with oxide, creating insulating regions 262, 264, respectively, according to one embodiment, as shown in FIGS. 6A-6C. The insulating regions 262, 264 electrically insulate the nFET and the pFETs from one another. The insulating regions 262, 264 have substantially straight, vertical sides, in contrast with the usual sloped sides. Oxide within the insulating regions 262, 264 is then planarized to stop on the cut hard mask 250, before the cut hard mask 250 is removed. The oxide is then recessed further so as to remove the pad oxide 242 from the fins 240. The insulating regions 262, 264 may extend beyond the tops of the fins 240, as shown in FIGS. 6B, 6C.

Figures 7A, 7B, 7C:
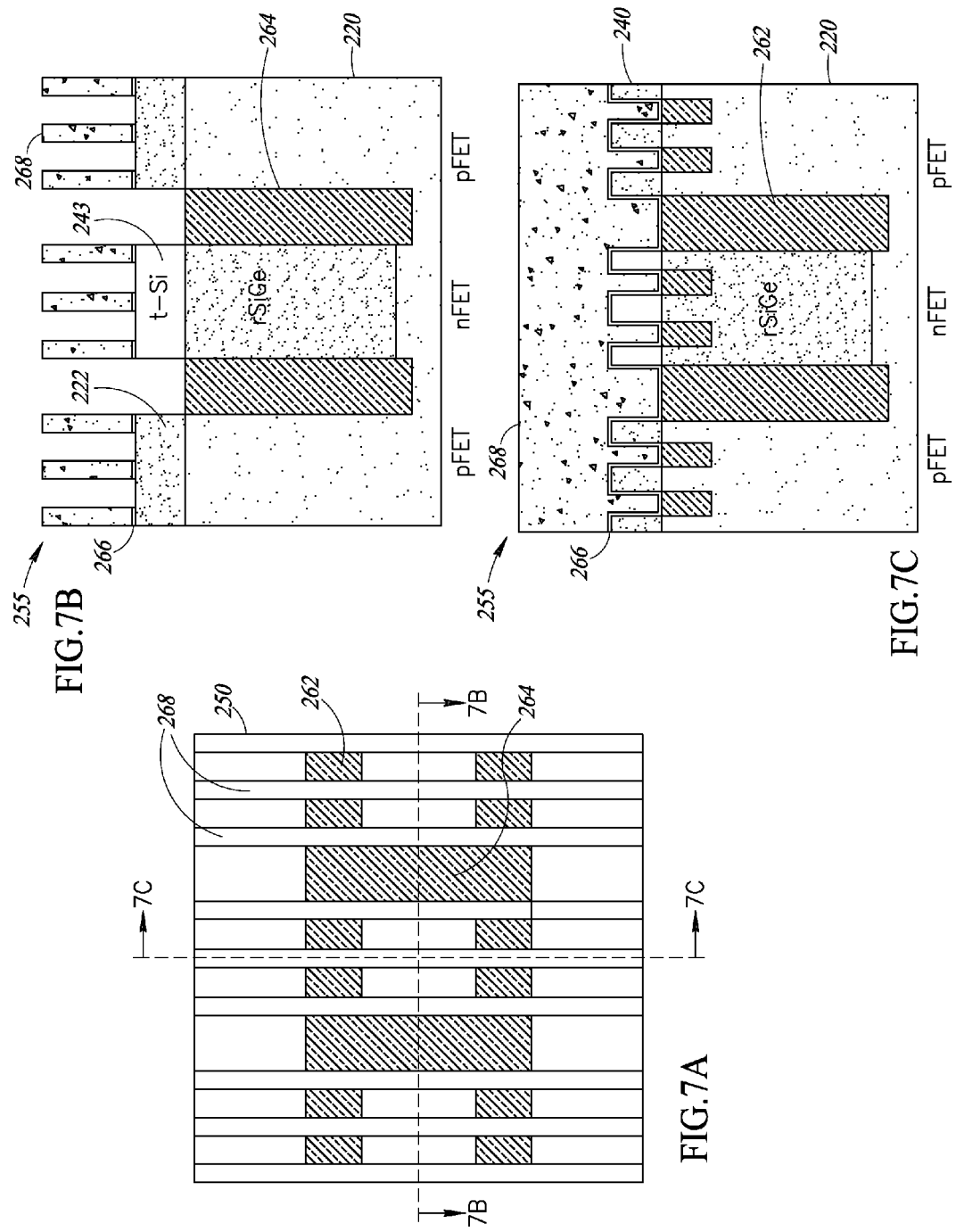
FIG. 7A is a top plan view of the nFET and pFETs, following formation of a polysilicon gate, according to one embodiment as described herein.
FIGS. 7B, 7C are cross-sectional views corresponding to FIG. 7A.

At 218, a gate structure 255 is formed transverse to the fins 240, according to one embodiment, as shown in FIGS. 7A-7C. The gate structure 255 of the FinFET devices wraps around three sides of each fin so as to control current flow therein more precisely than is possible in a conventional planar device. The gate structure 255 includes a gate dielectric 266 and a gate 268, which may be made of polysilicon, for example. Alternatively, the gate 268 may be made of metal, or it may be made of polysilicon initially and later replaced with metal using a replacement metal gate process as is well known in the art. First, oxide within the insulating regions 262, 264 is partially removed, down to the surface of the substrate 220. Next, the gate dielectric 266, e.g., a thin layer of SiO$_2$, HfO$_2$, or the like, is formed over the fins 240. Finally, a thick polysilicon gate 268 is formed on top of the gate dielectric 266, and the gate dielectric 266 and the polysilicon gate 268 are patterned with features transverse to the fins, in the usual way.

At 219, the source and drain regions are doped, according to one embodiment. The source and drain regions of the p-type compressive SiGe active layer 222, and of the n-type tensile silicon active layer 232, can be doped by ion or plasma implantation, or combinations thereof, using the existing gate structure 255 as a mask. Alternatively, raised source and drain regions may be grown epitaxially from the source and drain regions and doped in-situ. Using either technique, a self-aligned doping step completes formation of the co-integrated nFET and pFET devices.

Figure 8:
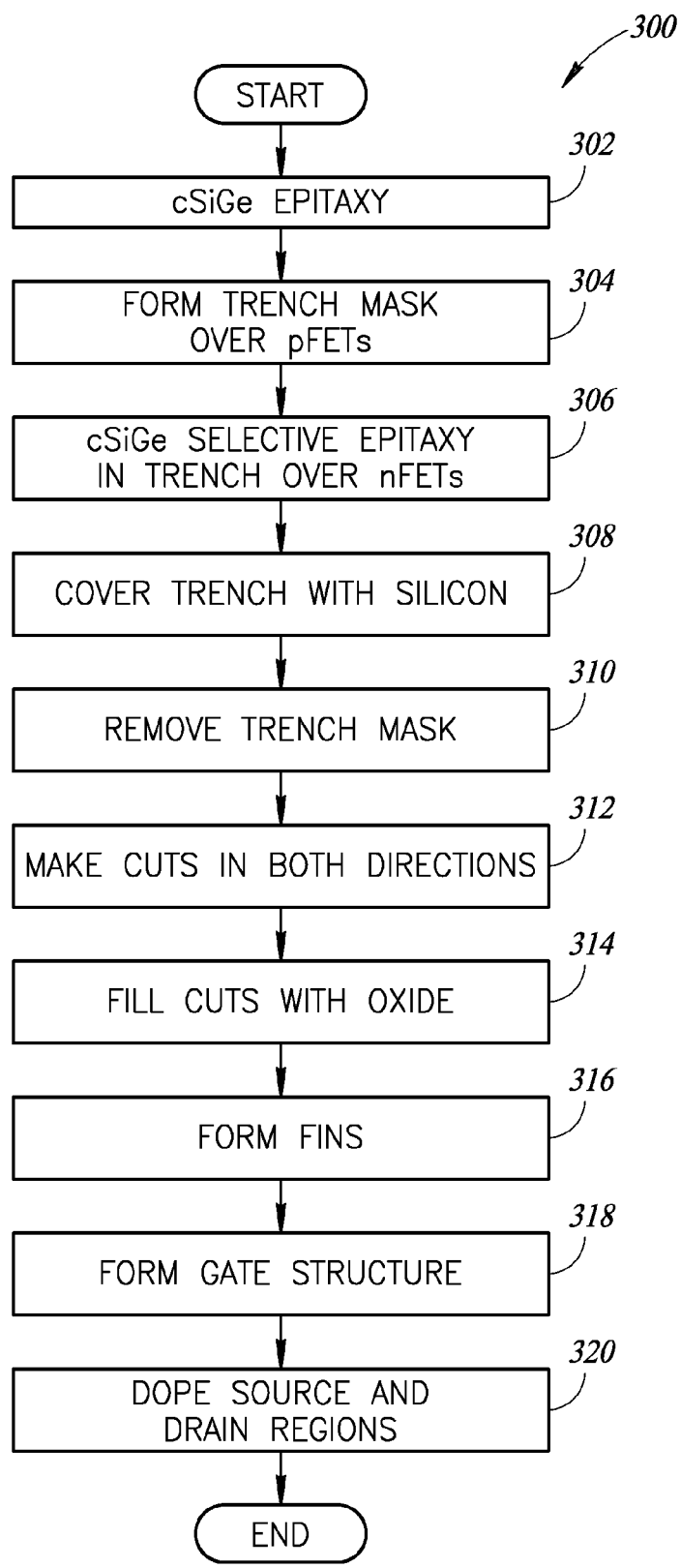
FIG. 8 is a flow diagram showing steps in a second method of fabricating an integrated circuit that includes compressive strained SiGe pFETs together with tensile silicon nFETs, according to an alternative embodiment as described herein.

FIG. 8 shows a series of steps in a method 300 of fabricating p-type FinFETs, or pFETs, having compressive strain, co-integrated with n-type FinFETs, or nFETs having tensile strain, according to an alternative embodiment. In the method 300, some steps occur in a different order, for example, the fins 240 are formed after the insulating regions 262, 264.

Figure 9:
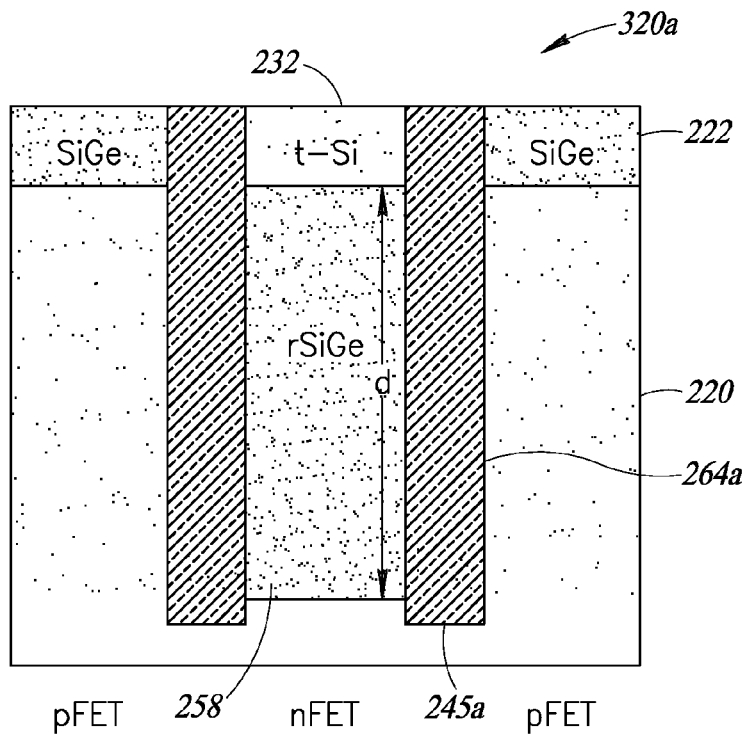
FIG. 9 is a cross-sectional view showing isolation regions between nFET and pFET devices, prior to fin formation, according to the second fabrication method shown in FIG. 8.
Figure 10:
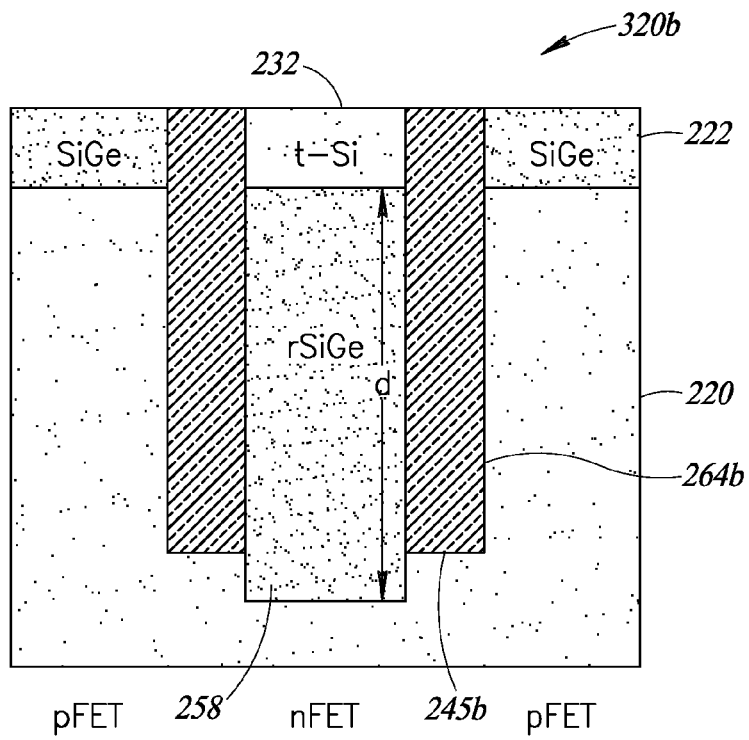
FIG. 10 is a cross-sectional view showing isolation regions between nFET and pFET devices that are shallower than the intervening strain-relaxed SiGe substrate, according to one embodiment as described herein.

FIGS. 9 and 10 show exemplary cross-sectional views of structures 320a,b formed in accordance with the method 300 that includes steps 302-320. The structures 320a,b show the nFET and pFETs following step 314, which is after completion of the insulating regions 264, but prior to formation of the fins 240 at 316. In FIG. 9, the insulating regions 264a extend to a depth 245a below the depth, d, of the strain-relaxed SiGe region 258. In FIG. 10, the insulating regions 264b extend to a depth 245b above the depth, d, of the strain-relaxed SiGe region 258. The sequence of steps in the exemplary method 300 is otherwise similar to those in the method 200. As in the method 200, the insulating regions 262 and 264 made by the method 300 can extend to a depth that is less than, equal to, or greater than, the depth of the trench that defines the boundary of the strain-relaxed SiGe region 258, while still inducing relaxation of the SiGe and tensile strain in the silicon active layer 232.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:
1. An integrated circuit comprising:
a silicon substrate;
a compressive SiGe active layer on the silicon substrate;
a p-type FinFET formed in the compressive SiGe active layer;
a strain-relaxed SiGe region inlaid in the silicon substrate;

a tensile silicon active layer on the strain-relaxed SiGe region and adjacent to the compressive SiGe active layer;

an n-type FinFET formed in the tensile silicon active layer; and electrically insulating regions positioned between the p-type and n-type FinFETs, and between the strain-relaxed SiGe region and the silicon substrate.

2. The integrated circuit of claim 1 wherein the tensile silicon active layer is surrounded by the compressive SiGe active layer.

3. The integrated circuit of claim 1 wherein the tensile silicon active layer is aligned vertically with the strain-relaxed SiGe region.

4. The integrated circuit of claim 1 wherein the insulating regions have substantially straight, vertical sides and widths in the range of 50 and 100 nm.

5. The integrated circuit of claim 1 wherein the electrically insulating regions extend above a top surface of the active layers.

6. The integrated circuit of claim 1 wherein the compressive SiGe active layer and the tensile silicon active layer have thicknesses in the range of 10 and 100 nm.

7. The integrated circuit of claim 1 wherein the compressive SiGe active layer has a germanium concentration in the range of 15% and 50%.

8. The integrated circuit of claim 1 wherein the compressive SiGe active layer has a width in the range of 40-1000 nm.

9. The integrated circuit of claim 1 wherein the strain-relaxed SiGe region extends to a depth of 50-400 nm into the silicon substrate.

10. The integrated circuit of claim 1 wherein the tensile silicon active layer and the compressive SiGe active layer have similar thicknesses.

11. An n-type device, comprising:
a substrate;
a strain-relaxed SiGe region formed within the substrate, the strain-relaxed SiGe region having a first depth;
an n-type tensile silicon layer on top of the strain-relaxed SiGe region;
a source region formed in the n-type tensile silicon layer;
a drain region formed in the n-type tensile silicon layer;
a fin coupling the source region to the drain region;
electrically insulating regions positioned between the device and the substrate, the electrically insulating regions having a second depth that is greater than the first depth; and
a gate structure that wraps around three sides of the fin.

12. The n-type device of claim 11 wherein the gate structure includes a gate dielectric and a polysilicon gate.

13. The device of claim 11 wherein the gate structure includes a gate dielectric and a metal gate.

14. The device of claim 11 wherein the strain-relaxed SiGe region is substantially free of crystalline defects.

15. The device of claim 11, wherein the electrically insulating regions have substantially straight sides extending 50-400 nm into the substrate.

16. An integrated circuit comprising:
a silicon substrate;
first and second compressive SiGe active regions on the silicon substrate;
a strain-relaxed SiGe region inlaid in the silicon substrate;
a tensile silicon active layer on the strain-relaxed SiGe region and between the first and second compressive SiGe active regions;
transistors formed in the first and second compressive SiGe active regions and in the tensile silicon active layer;
a first electrically insulating region extending into the silicon substrate and along a first side wall of the strain-relaxed SiGe region; and
a second electrically insulating region extending into the silicon substrate and along a second side wall of the strain-relaxed SiGe region.

17. The integrated circuit of claim 16, wherein the first electrically insulating region extends between the first compressive SiGe active region and the tensile silicon active layer, and the second electrically insulating region extends between the second compressive SiGe active region and the tensile silicon active layer.

18. The integrated circuit of claim 16, wherein the tensile silicon active layer is aligned vertically with the strain-relaxed SiGe region.

19. The integrated circuit of claim 16, wherein the strain-relaxed SiGe region has a first depth into the silicon substrate and the first and second electrically insulating regions having second depths that are greater than the first depth.

20. The integrated circuit of claim 16, wherein the transistors include:
a plurality of p-type FinFETs formed in the first and second compressive SiGe active regions; and
a plurality of n-type FinFETs formed in the tensile silicon active layer.

* * * * *